United States Patent [19]

Abe et al.

[11] 4,395,440
[45] Jul. 26, 1983

[54] METHOD OF AND APPARATUS FOR MANUFACTURING ULTRAFINE PARTICLE FILM

[75] Inventors: Atsushi Abe, Ikoma; Hisahito Ogawa, Nara; Masahiro Nishikawa, Amagasaki, all of Japan

[73] Assignee: Matsushita Electric Industrial Co., Ltd., Osaka, Japan

[21] Appl. No.: 309,088

[22] Filed: Oct. 6, 1981

[30] Foreign Application Priority Data

Oct. 9, 1980 [JP] Japan ................................ 55-141218
Oct. 9, 1980 [JP] Japan ................................ 55-141219

[51] Int. Cl.³ ........................ B05D 1/12; C23C 11/00
[52] U.S. Cl. .............................. 427/180; 427/255.2; 427/255.3; 118/50; 118/719; 118/726
[58] Field of Search ................ 427/249, 255.2, 255.3, 427/78; 118/180, 719, 726, 50

[56] References Cited

U.S. PATENT DOCUMENTS 1,420,888  6/1922  Straw .......................... 427/255.3 X
4,096,026  6/1978  Takeuchi ........................ 427/255.3

FOREIGN PATENT DOCUMENTS 530299  9/1956  Canada ............................. 118/715
966161  8/1964  United Kingdom .............. 427/255.3

*Primary Examiner*—Shrive P. Beck

*Attorney, Agent, or Firm*—Stevens, Davis, Miller & Mosher

[57] ABSTRACT

A method and apparatus for manufacturing an ultrafine particle film which has great practical utility when deposited on an appropriate substrate. The particle film is produced from various ultrafine particles of, for example, metals, oxides, nitrides and carbides, and is produced uniformly, effectively and efficiently with a high degree of reproducibility. According to a first method, an atmosphere at a gas of a reduced pressure is formed in a vessel, and a forced flow of the gas is formed unidirectionally from an evaporation source to the substrate, so that the evaporated matters from the evaporation source are forced to move together with the forced flow of the gas, so that ultrafine particles which are formed through interaction between the evaporated matters and the gas deposited on the substrate thereby forming the ultrafine particle film. According to a second method, the evaporation source is disposed within a vessel of having a reduced gas pressure as well as a cylinder surrounded by a high-frequency coil. As the coil is energized, the gas in the cylinder is excited. The evaporated matters are forced to flow through the excited gas atmosphere so that ultrafine particles formed by an interaction between the evaporated matters and the excited gas are deposited on the substrate thereby forming the ultrafine particle layer. A third method is a combination of the first and second methods.

6 Claims, 9 Drawing Figures

METHOD OF AND APPARATUS FOR MANUFACTURING ULTRAFINE PARTICLE FILM

BACKGROUND OF THE INVENTION

The present invention relates to a method of and apparatus for manufacturing ultrafine particle film and, more particularly, to a method of and apparatus for manufacturing ultrafine particle film of ultrafine particles such as of metals, oxides, nitrides, carbides and so forth, on a substrate at a good reproducibility, uniformly, effectively and efficiently.

The present inventors have made some proposals concerning the manufacture of ultrafine particle films. The characteristic features and practical problems of these proposed technics will be explained hereinunder.

For instance, Japanese Patent Laid-Open No. 28334/80 discloses an apparatus having a vessel for forming ultrafine particles. The space in the vessel is divided at least into an upper chamber and a lower chamber by means of a partition plate having an aperture which is adapted to be closed by means of a shutter mechanism. An evaporation source is disposed in the lower chamber while a substrate on which the ultrafine particles are to be deposited is disposed in the upper chamber. In this case, since the aperture of the partition plate is adapted to be opened and closed by means of a shutter, the ultrafine particles are prevented from coming from the lower chamber to the upper chamber when the shutter is kept closed. It is, therefore, possible to precisely control the amount of deposition of the ultrafine particle film. In addition, it is possible to obtain a good symmetry of the convection in the upper chamber because the ultrafine particles are supplied into the upper chamber through the aperture. Thus, this technique offers the advantage of uniform deposition of the ultrafine particles to the substrate, and can be suitably be used in the formation of an ultrafine metallic particle film. On the other hand, however, this technique imposes the following problem when the pressure of atmospheric gas for forming the ultrafine metallic particle film is low. Namely, to obtain the required thickness of the ultrafine particle film, it is necessary that the distance between the evaporation source and the substrate be sufficiently small. However, a too short distance between the evaporation source and the substrate causes the temperature of the substrate to rise excessively which deteriorates the film the result being an inferior performance of the ultrafine particle film.

The present inventors have proposed in Japanese Patent 151575/79 another apparatus in which gases in a vessel are excited and activated by a high-frequency electric field, and various vapors for forming the ultrafine particles are supplied to the atmosphere containing the activated gases, thereby to form various ultrafine particles. In this case, the gases in the vessel are excited and activated by a high-frequency electric field of 13.56 MHz applied to a high-frequency coil for an easier reaction with metal vapors, to facilitate various ultrafine particles such as oxides, nitrides, carbides and so forth. According to this technique, therefore, it is possible to easily form various ultrafine particles having low vapor pressure and high melting point such as oxides, nitrides, carbides and so forth, by evaporating a material having a low melting point and high vapor pressure, such as metals. As has been explained, this technique is useful for the manufacture of ultrafine particle films, but still suffers several practical problems as stated below.

First, it is to be pointed out that, since the high-frequency coil is wound at a comparatively low density, the vapor introduced into the chamber accomodating the gases excited by the high-frequency coil remains not only at the inside of the coil but is scattered also to be outside of the coil. This is attributable to the fact that the mean free path of the gas or vapor in the chamber is extremely short due to the high pressure in the chamber.

The above-explained point does not cause any substantial problem provided that the plasma is uniformly formed in the chamber. Generally, however, it is extremely difficult to form a uniform plasma in the chamber, although the state of plasma varies depending on various factors such as the size and shape of the high-frequency coil, gap between the walls defining the chamber and the high-frequency coil and so forth. In other words, it is extremely difficult to form uniform ultrafine particles, unless the plasma is formed uniformly. In addition, it is often experienced that some of the ultrafine particles formed in the chamber undesirably attach to the wall of the chamber. To avoid this, it is necessary to take practical countermeasures.

The second problem is that the apparatus is too complicated and expensive. This is caused by the fact that the ultrafine particles formed in the chamber and other ultrafine particles attaching to these particles are induced from the chamber of locally high by means of a D.C. electric field applied between the evaporation source and the substrate.

The third problem is that, since the coil itself is exposed to the high-frequency plasma, there is a possibility that the atoms released from the coil are retained as impurities by the ultrafine particle film, in which a high purity is desirable.

In regard to the formation of ultrafine particle films such as of oxides, nitrides, carbides and so forth, the technique disposed in Japanese Patent Laid-Open No. 28334/80 is rather inferior to the method disclosed in Japanese Patent Laid-Open No. 151575/79 in which the ultrafine particles are formed in an excited gaseous atmosphere, for the practical reasons shown below.

Namely, the former technique requires the additional step of heat treatment for controlling the composition of the ultrafine particles. In addition, the mean particle size of the ultrafine particles tends to be changed by the heat treatment. These reasons will be described in more detail in the description of the preferred embodiments.

The ultrafine particle films have wide application including atmospheric sensors for sensing humidity and gas, infrared ray sensors, laser power meters, selective absorption films for solar thermal conversion, photo-information storage films, catalysts and so forth.

Under these circumstances, the present inventors have proposed, in Japanese Patent Laid-Open No. 27925/80, a method of manufacturing an ulrafine particle film sensor consisting of ultrafine particles of oxides of Sn which is very useful as the material of gas sensors and humidity sensors. The essence of this proposal resides in a process having the steps of evaporating Sn or an oxide of Sn ($SnO$, $SnO_2$) in an atmosphere of a gas pressure of between 0.1 and 1 Torr, and depositing the evaporated ultrafine particles on a substrate to form an ultrafine particle film of an Sn oxide thereby forming a sensitive body.

The prior art methods heretofore described are those which have various drawbacks although having various advantages as explained.

SUMMARY OF THE INVENTION

Accordingly, an object of the invention is to provide a novel method and apparatus for manufacturing ultrafine particle films capable of overcoming the above-described problems of the prior art while making positive use of the advantages of the prior art.

To this end, according to one aspect of the invention, there is provided a method of manufacturing an ultrafine particle film comprising the steps of: disposing an evaporation source and a substrate in such a manner as to oppose each other in the axial direction of a cylinder situated in a gas atmosphere having a reduced pressure; forming ultrafine particles by having the evaporated matter from the evaporation source act on the gas; and transferring the ultrafine particles through the interior of the cylinder so as to deposit the latter on the substrate.

According to another aspect of the invention, there is provided an apparatus for manufacturing an ultrafine particle film comprising: a vessel having therein a cylinder, an evaporation source for evaporating the material of the ultrafine particles and a substrate receiving the ultrafine particle deposited thereon, the evaporation source and the substrate are disposed so as to oppose each other in the axial direction of the cylinder; and means for reducing the pressure in the vessel.

The method and apparatus of the invention are intended to make positive use of the advantages of the prior art. Namely, the invention enables, when applied to the manufacture of metallic ultrafine particle film, an ultrafine particle film of a superior performance to form in a short period of time with an increased distance between the evaporation source and the substrate as compared with the prior art, while achieving an improvement in the reproducibility and also in the uniformity of the films. The invention can provide, when applied to the manufacture of the oxides, nitrides and carbides, a high reproducibility and uniformity of the film characteristics and a highly effective and efficient manufacture of the ultrafine particle film.

The above and other objects, as well as advantageous features of the invention will become clear from the following description of the preferred embodiments taken in conjunction with the accompanying drawings.

DESCRIPTION OF THE PREFERRED EMBODIMENTS

Figure 1:
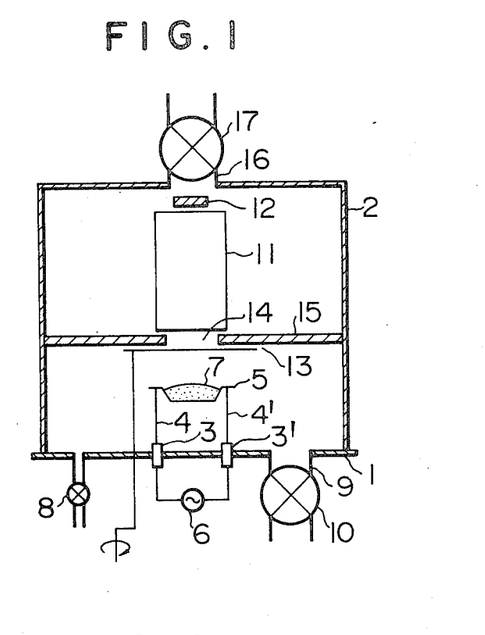
FIGS. 1 and 2 are diagramatic illustrations of an apparatus suitable for use in carrying out the method of the invention.

Referring to FIG. 1 showing an apparatus in accordance with the invention for manufacturing an ultrafine particle film, a vacuum vessel is composed of a bottom panel 1 and a bell jar 2. A boat 5 constituting an evaporation source is supported in the vacuum vessel by means of a pair of conductors 4, 4' serving as the supporting members. The conductors 4, 4' extend downwardly through the bottom panel 1. Bushings 3, 3' provide seals between the bottom panel 1 and the conductors 4, 4', as well as an electrical insulation therebetween. As the electric power is supplied to the boat 5 from a power source 6, the boat 5 is heated to evaporate an evaporation material 7 such as for example Au. The Au vapor collides with the molecules of the gas introduced into the vacuum chamber to form ultrafine Au particles of extremely fine particle size.

Figure 2:
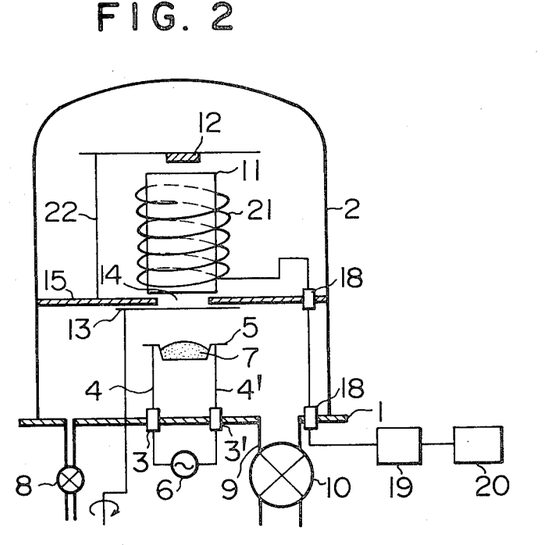

In these Figures, a reference numeral 8 designates a valve for introducing an inert gas such as He, Ar or $N_2$, while a numeral 9 denotes a discharge pipe which is connected to a vacuum system (not shown), comprising a vacuum pump or the like, through a discharge valve 10.

The space inside the vacuum vessel is divided by the partition plate 15 into at least two chambers, namely, an upper chamber and a lower chamber. The partition plate 15 has an aperture 14. In this case, the greater part of the inert gas introduced into the lower chamber flows into a cylinder 11 through the aperture 14. Needless to say, substantially all the gas introduced flows into the cylinder 11, if the cylinder 11 contacts at its bottom with the partition plate 15.

A substrate 12 supported by a supporting member (not shown) is located in an upper portion of the vacuum vessel. A shutter 13 is disposed rotatably between the substrate 12 and the evaporation source 5.

It is of course possible to provide another shutter between the cylinder 11 and the substrate 12. The position of the shutter may be varied as desired without departing from the spirit of the invention.

A reference numeral 16 denotes a discharge pipe disposed above the substrate 12 and connected to a vacuum discharge system (not shown), comprising a vacuum pump, through a discharge valve 17.

Needless to say, it is possible to use a single vacuum discharge system commonly for both of the upper and lower chambers. In other words, the invention can fairly be carried out even when the discharge pipe 9 and the discharge valve 10 shown in FIG. 1 are eliminated. The number and position of discharge pipes may be varied, if necessary, within the scope of the invention.

The essential feature of the invention resides in the fact that a unidirectional flow of the gas is generated at least in the cylinder 11. This does not exclude any flow of gas outside the cylinder 11. It is, however, necessary that a suitable consideration be made as to, for example, the position of the substrate 12, in order to prevent the evaporated matter carried by the gas flowing outside the cylinder 11 from being deposited on the surface of the substrate 12.

An explanation will be made hereinunder as to a method of manufacturing ultrafine particle film in accordance with one embodiment of the invention.

After placing constituents or parts in the positions as shown in FIG. 1, the discharge valve 10 is opened while the gas introduction valve 8 and the discharge valve 17 are kept closed, so that the upper and lower chambers of the vacuum vessel are evacuated to a vacuum higher than $1 \times 10^{-6}$ Torr. Then, the discharge valve 10 is closed and the gas introduction valve 8 is opened to progressively supply the inert gas while opening the discharge valve 17 to continuously discharge the supplied gas. In other words, by simultaneously effecting the supply of the gas and the discharge of the gas, it is possible to maintain the inside of the vacuum vessel at a substantially constant pressure of between, for example, 0.1 and 10 Torr, while forcibly generating a unidirectional flow of gas from the side adjacent to the evaporation source towards the side adjacent to the substrate, through the cylinder 11. The vacuum discharge system used in this case preferably hs a rotary pump. This type of pump is currently widely available.

The discharge pipe 16 preferably opens from the portion of the bell jar 2 just above the cylinder 11 underlying the substrate 12.

It is also preferred that the aperture 14 has a symmetric form, such as a circular form. In the case where a circular perforation is used, the diameter of the aperture 14 is equal to or smaller than the diameter of the cylinder 11. Accordingly, in such case, the discharge pipe 16 also preferably includes a circular cross-section. All that is necessary is that the flow of gas through the cylinder 11 is uniform over the entire area of the substrate 12. This means that the cross-sectional shapes of the aperture 14, cylinder 11 and the discharge pipe 16 are to be changed in accordance with a change in the shape of the substrate 12. It is not essential that a single substrate 12 is disposed. Rather, in some cases, it is preferred that a plurality of substrates are mounted. In such cases, it will be necessary to attain a suitable geometrical arrangement of the substrates or the substrate holders in such a manner that the flow of the gas is uniformly applied to the plurality of substrates.

A practical process in accordance with this embodiment will be explained hereinunder on the assumption that the shutter 13 is not in contact with the partition plate 15 but is spaced by a suitable distance from the partition plate 15.

The gas continuously introduced into the chamber flows into the cylinder 11 through the gap between the shutter and the partition plate and is continuously discharged through the discharge pipe 16 to create a stable unidirectional flow of gas having a constant pressure in the cylinder 11. Then, the boat 5 is heated to start the evaporation of the Au as the evaporation material. After a steady flow of the vapor of Au is obtained, the shutter 13 is opened to introduce the flow of vapor of Au into the cylinder 11, so that the ultrafine particles of Au are deposited on the surface of the substrate 12 to form an ultrafine particle film on the latter.

Preferably, a specific consideration is made as to the construction of the shutter 13 to avoid the Au vapor or Au ultrafine particles coming into the cylinder 11 before opening the shutter 13.

Alternatively, the shutter 13 is eliminated and another shutter is formed to cover the surface of the substrate 12. In this case, the shutter covering the surface of the substrate 12 is opened after the flows of both the gas and the vapor become steady, so as to form an ultrafine particle film of Au on the surface of the substrate 12.

A modification of the apparatus of the invention will be explained hereinunder with specific reference to FIG. 1.

In this modification, the upper chamber separated by the partition plate 15 is eliminated and the cylinder 11 is placed in airtight-contact with the partition plate 15. The discharge pipe 16 is integrated with the cylinder 11. It is possible to form an ultrafine particle film of Au equivalent to that produced by the apparatus explained alone.

In forming the ultrafine particle film of a metal by using the apparatus shown in FIG. 1 or the apparatus modified from the apparatus shown in FIG. 1, it is possible to maintain a distance between the evaporation source and the substrate several times as large as that in the prior art in which no forcible flow of the gas is effected, i.e. the gas is moved solely by the convection caused by the heating.

It is true that the convection is enhanced to increase the amount of ultrafine particles which reach the substrate spaced upwardly from the evaporation source, by increasing the temperature of the evaporation source. In such a case, however, the particle size of the ultrafine particles becomes excessively large and the temperature of the substrate becomes impractically high.

For instance, in the case where an ultrafine particle film of Au is formed in an Ar gas atmosphere of several Torr, sintering of the ultrafine particle film of Au takes place when the substrate temperature is raised to a level above a hundred and several tens of Celcius scale. In consequence, the ultrafine particle film, which originally has a black color, changes to exhibit a brown color.

This problem, however, is overcome by the method of the present invention which employs the forced flow of the gas. Namely, in the method of the invention, it is possible to maintain the substrate temperature sufficiently low, partly because the ultrafine particles of sufficiently small mean particle size can be formed at a comparatively low temperature of the evaporation source and partly because the distance between the evaporation source and the substrate can be increased without substantial decrease in amount of deposition of the ultrafine particles on the substrate.

The prior art methods have suffered from the disadvantage that the amount of deposition of the ultrafine particles on the substrate per unit time is reduced as the atmospheric gas pressure is decreased, for example, from 10 Torr to 0.1 Torr, provided that the distance between the evaporation source and the substrate is unchanged. It has been confirmed that such a drawback is advantageously eliminated in the method of the invention.

Hereinunder, an explanation will be made as to another embodiment of the apparatus of the invention with specific reference to FIG. 2. This embodiment can effectively form the ultrafine particle film of oxides, nitrides, carbides and so forth uniformly, effectively and efficiently at a higher reproducibility. In FIG. 2, the same reference numerals are used to denote the same parts or members as those incorporated in the apparatus of the first embodiment shown in FIG. 1. These same parts perform equivalent operations and functions.

In the embodiment shown in FIG. 2, a high-frequency coil 21 made of stainless steel opened at its one end is disposed to surround the cylinder 11 which is made of, for example, quartz. The high-frequency coil 21 is adapted to be supplied with a high-frequency electric power from a high-frequency power source (13.56 MHz) through a bushing 18 and a matching box 19.

Hereinunder, an explanation will be made as to the production of ultrafine particle film of oxide particles, particularly oxides of Sn, by way of example.

A reference numeral 8 designates a valve for introducing $O_2$ gas into the vessel. After placing the constituents at the proper positions in the vessel, the $O_2$ gas introduction valve 8 is closed and the discharge valve 10 is opened to permit an evacuation of the vessel to a vacuum of, for example, $1 \times 10^{-6}$ Torr or higher. Then, after closing the discharge valve 10, the valve 8 is opened to establish a predetermined constant pressure in the vessel. Alternatively, a constant pressure of, for example, between 0.1 and 10 Torr is maintained by depressurizing the vessel while supplying the same with the gas.

The gas introduction port may be formed in the upper chamber of the vessel 2. Needless to say, in the case where the shutter 13 and the partition plate 15 are held in gas-tight contact with each other, it is necessary to open the shutter 13 to provide a communication between the upper and lower chambers, during the vacuum evacuation and the gas introduction. Alternatively, another evacuation or discharge system is connected to the upper chamber. The aperture 14 preferably has a form with a good symmetry, such as a circular form. The diameter of the circular aperture 14 is preferably equal to or smaller than that of the cylinder 11.

In the aforementioned prior art disclosed in Japanese Patent Laid-Open No. 151575/79, there is a practical limit in the size of the aperture for allowing the vapor flow into the chamber containing the gas excited by the high-frequency coil. The capacity of the pump for inducing the gas in the chamber, as well as the capacity of the pump for evacuating the space around the chamber, can be reduced as the size of the aperture is decreased. In other words, in order to maintain the pressure difference between the inside of the chamber and the space around the chamber by elevating the pressure in the chamber relative to the pressure outside the chamber, it is essential to increase the evacuation rate of the pump as the aperture size is increased. If the aperture size is increased too far, the pump flow rate will be increased to an impractical level.

The high-frequency coil 21 is supplied with a high-frequency electric power of 13.56 MHz from the high-frequency power source 20 through the matching box 19. This high-frequency electric power excites and activates the oxygen gas in the cylinder 11. After the plasma has been stabilized, the boat 5 is heated by electric power while the aperture 14 is kept closed by the shutter 13, thereby commencing the evaporation of the metallic material 7 which is in this case Sn. After a steady evaporation rate is obtained, the aperture 14 is opened to permit the Sn vapor to come into the atmosphere of oxygen plasma in the cylinder 11 through the aperture 14. The formation of the ultrafine particle film in accordance with the invention is never affected even if the oxygen plasma generated in the cylinder 11 is extended to the region of the boat 5.

It is of course possible to use a crucible in place of the boat 5. The heating of the boat 5 can be effected not only by resistance heating but by induction heating as well.

The atmospheric gas in the vacuum vessel may be an oxidizing gas, reducing gas or a mixture of both.

In the case where the atmosphere in the cylinder 11 is a plasma gas which contains $O_2$, ultrafine particles of oxides are formed. Similarly, ultrafine particles of nitrides and carbides are formed when the atmosphere in the cylinder 11 contains, for example, $NH_3$, and when the same contains, for example, $CH_4$, respectively.

It is possible to use a plurality of evaporation materials. The different evaporation materials may be positioned either at substantially the same or different positions within the bell jar 2.

In this embodiment, therefore, it is possible to form a composite ultrafine particle film or a plurality of layers of ultrafine particle layers on the substrate and to control the amount of deposition of the ultrafine particles, by suitably controlling the operation of the shutter.

Needless to say, the illustrated position of the shutter 13 in FIGS. 1 and 2 is not exclusive. For instance, the shutter 13 may be disposed between the substrate 12 and the cylinder 11. It is also possible to form ultrafine particle films of oxides, nitrides and carbides by using the apparatus shown in FIG. 1, provided that the high-frequency coil 21 is prepared around the cylinder 11 of FIG. 1.

Figure 3:
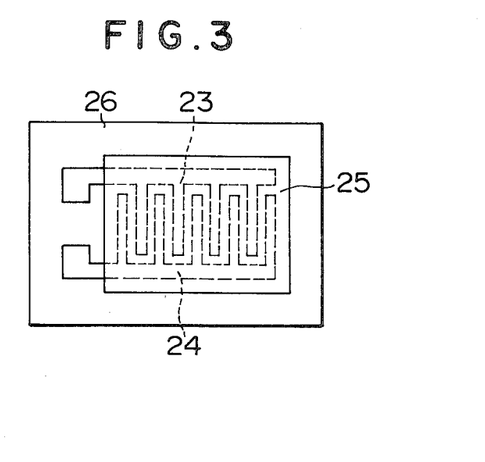
FIG. 3 illustrates an example of ultrafine particle film manufactured in accordance with a manufacturing method of the invention.

FIG. 3 illustrates an example of the ultrafine particle film suitable for as a sensor, manufactured in a manner previously explained. A pair of electrodes 23, 24 is preliminarily formed on the substrate 26 by evaporation or a like method and an ultrafine particle film 25 is formed on the substrate to cover these electrodes. The electrical resistance between the two electrodes 23, 24 is changed in accordance with the density of the gas, the presence of moisture, or other factors, as the sensor is placed in an atmosphere in which it is the sensing object.

A characteristics of the sensor having the sensitive layer formed of the ultrafine particle film of Sn oxide produced in accordance with this method largely varies depending on the conditions of production. The factors or parameters which affect the characteristics most heavily are the temperature of the Sn evaporation source and the level of the high-frequency electric power.

In order to facilitate the understanding of the advantages of the invention, an explanation will be made hereinunder in comparison with a typical conventional manufacturing method.

Figure 4:
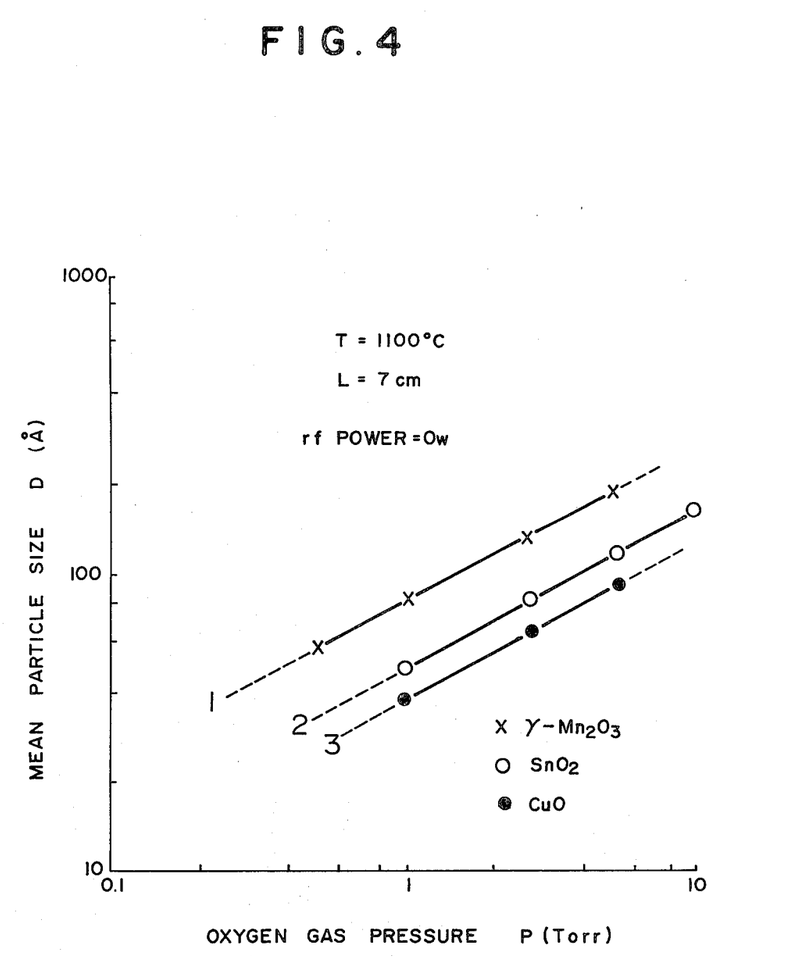
FIGS. 4, 5, 6, 7 and 8 are illustrations of the operation of an apparatus in accordance with the invention.
Figure 7:
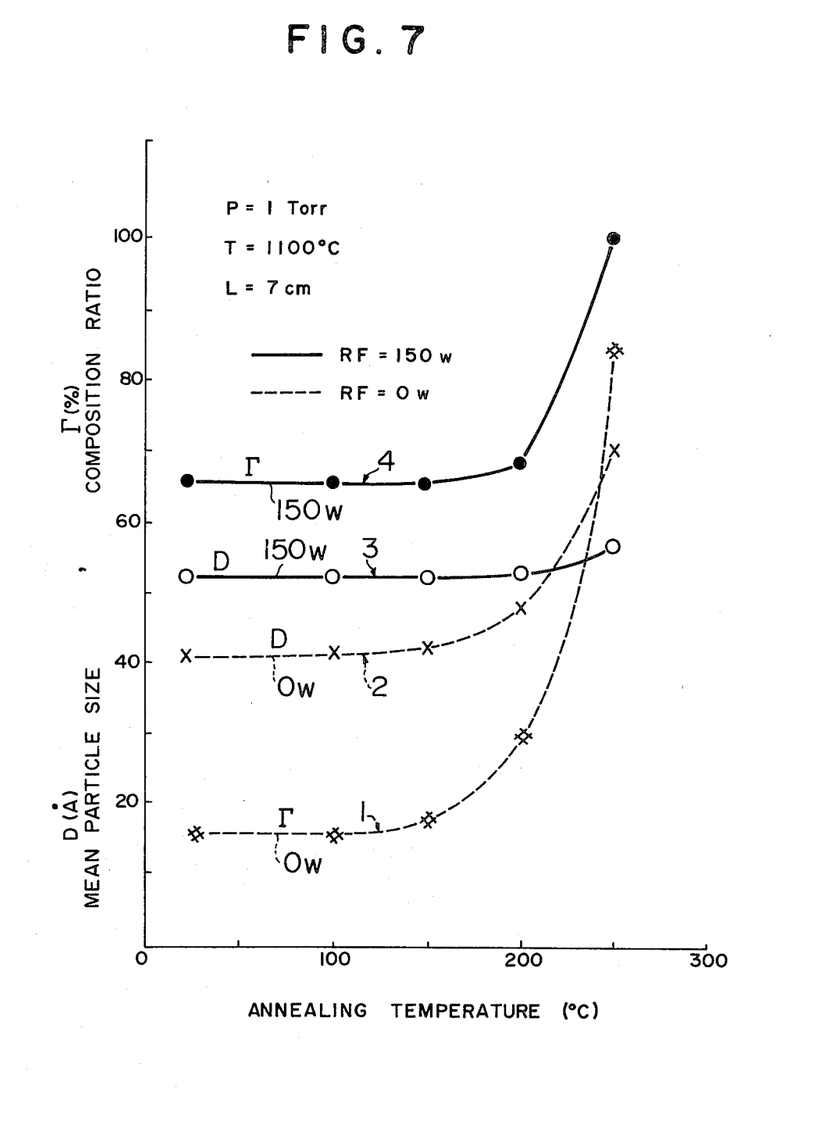

Referring to FIG. 4, a curve (2) represents the relationship between the mean particle size D and the $O_2$ gas pressure P, in a process for forming an ultrafine particle film of Sn oxide in an $O_2$ gas atmosphere of a reduced pressure, without applying high-frequency electric power. The mean particle size D is the value obtained through a calculation from the spectrum of an X-ray diffraction curve measured before the heat-treatment as shown in FIG. 7.

The ultrafine particle film of Sn oxides thus formed is a film comprising a mixture of ultrafine particles of $SnO_2$ and SnO. Therefore, the X-ray diffraction curve exhibits two distinctive peaks for $SnO_2$ and SnO. The mean particle size D shown in FIG. 4 is the one determined from the peak for $SnO_2$.

The following relationship exists between the mean particle size D and the gas pressure P.

$$D = KP^{\frac{1}{2}} \text{ (K: constant)}$$

It is, therefore, possible to determine the mean particle size D if the $O_2$ gas pressure P is given. Curves 1 and 3 in FIG. 4 show the characteristics as observed when the ultrafine particle film is formed from other materials. These curves clearly show that the above-mentioned relationship applies generally.

Figure 5:
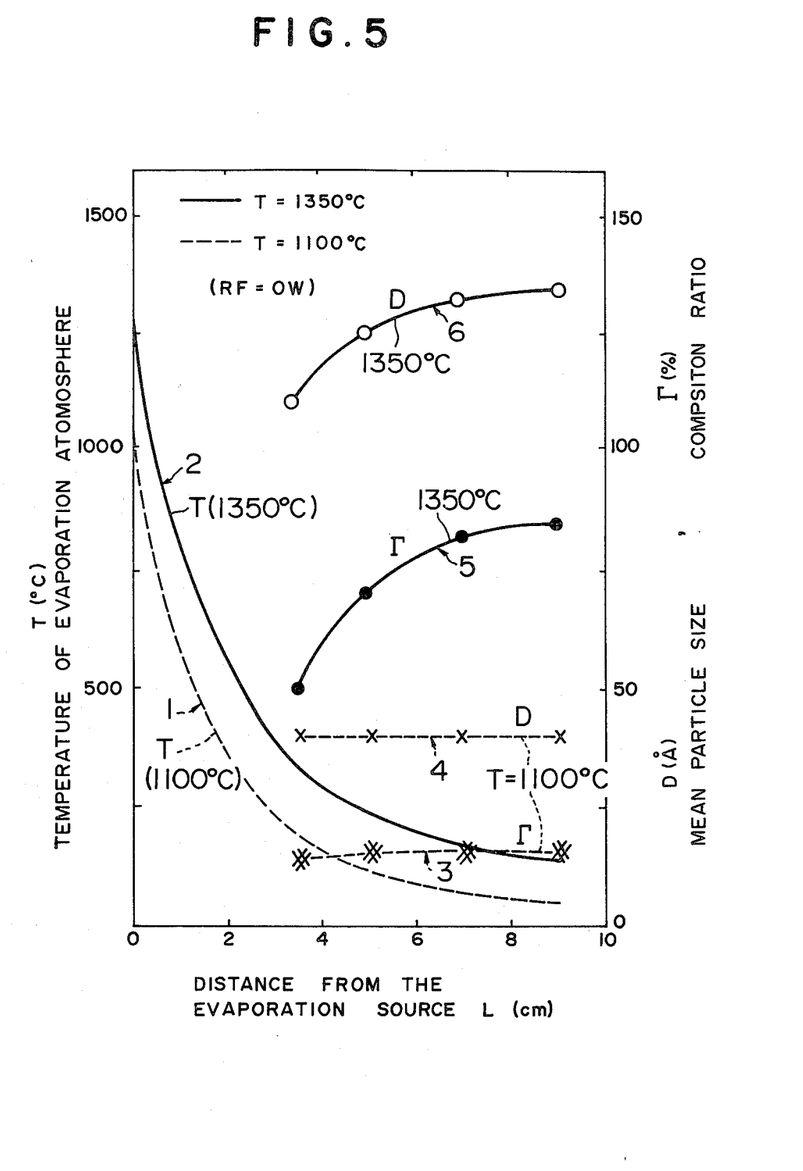

Curves 1 and 2 in FIG. 5 show the change in the temperature of the evaporation atmosphere at a point spaced by a distance L (cm) from the evaporation source (L=0 cm) when the temperature of the Sn evaporation source is set at 1100° C. and 1350° C., respectively, with the high-frequency electric power RF of 0

(zero). In both cases of curves 1 and 2, a drastic temperature drop is observed as the distance from the evaporation source is increased. When the evaporation source temperature T is 1100° C., neither the mean particle size D(Å) of the ultrafine particles constituting the ultrafine particle film nor the composition ratio $\Gamma$ (%) (rate of $SnO_2$ content in the mixture of $SnO_2$ and SnO) exhibits appreciable dependency on the distance L, as will be realized from curves 3 and 4. In contrast, when the evaporation source temperature is 1350° C., the mean particle size and the composition ratio are increased in accordance with the increase of the distance L in a saturating tendency.

When the ultrafine particle film of Sn oxide is used, for example, as a gas sensitive film, it is necessary that the mean particle size of the ultrafine particles is small and the composition ratio $\Gamma$ is 100% $SnO_2$.

Referring to FIG. 5, since the composition ratio $\Gamma$, as observed when the evaporation temperature is 1350° C., is greater than that observed when the evaporation temperature is 1100° C., the mean particle size D is increased excessively as will be understood from the comparison between the curves 3 and 5 and the curves 4 and 6. In addition, both the composition ratio $\Gamma$ and the mean particle size D exhibit a greater temperature dependency, as will be seen from curves 5 and 6. Thus, an impractically strict control of the distance L is required when the manufacture of the ultrafine particle film is conducted at the elevated evapporation source temperature of 1350° C.

On the other hand, when the temperature is 1100° C., neither the mean particle size D nor the composition ratio $\Gamma$ exhibit any appreciable dependency on the distance therebetween, as will be understood from curves 3 and 4. In this case, however, there is the problem that the composition ratio $\Gamma$ is small.

Figure 6:
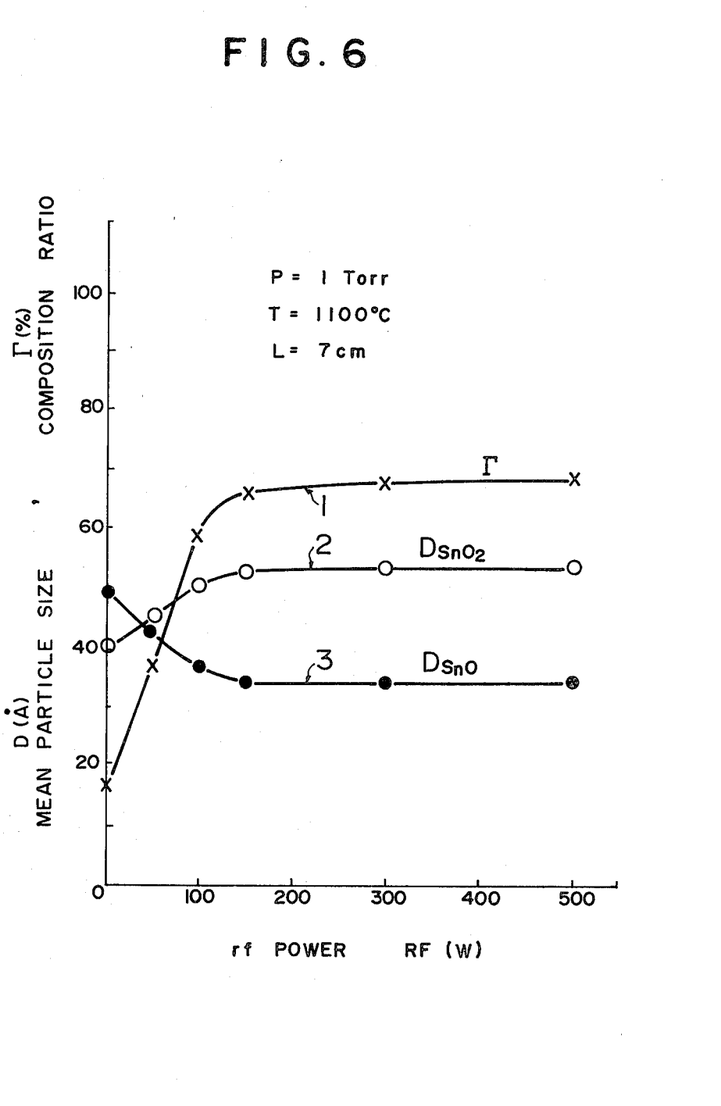

Hereinafter, an explanation will be made as to how the high-frequency electric power is applied in the method of the invention. FIG. 6 shows the relationships between the high-frequency electric power RF and the mean particle size D, and between the high-frequency electric power RF and the composition ratio $\Gamma$, as observed when an Sn oxide ultrafine particle film is formed in the atmosphere excited by the high-frequency electric power. The values $\Gamma$ and D are derived through calculation from the spectrum of an X-ray diffraction curve as measured beforehand of a heat treatment as shown in FIG. 7.

The mean particle sizes $D_{SnO_2}$ and $D_{SnO}$ of the ultrafine particles constituting the ultrafine particle film of Sn oxides are varied as the high-frequency electric power RF is increased, but held in substantially constant values irrespective of the high-frequency electric power RF when the latter is beyond 150 W, as will be seen from curves 2 and 3, respectively. A similar tendency is observed also from the composition ratio $\Gamma$, as will be seen from a curve 1.

FIG. 7 shows how the mean particle size D and the composition ratio $\Gamma$ are changed when the ultrafine particle film of Sn oxide, which was formed in an $O_2$ atmosphere of a pressure of 1 Torr at the evaporation source temperature of 1100° C. and with the high-frequency electric power of 150 W, is heat-treated in the air. The characteristics of the ultrafine particle film manufactured by the method of the invention are shown by full-line curves 3 and 4, while broken-line curves 1 and 2 show the characteristics of the ultrafine particle film manufactured by a conventional method employing no application of the high-frequency electric power.

By treating, for example, in the air the Sn ultrafine particle film manufactured by the conventional process at an evaporation source temperature of 1100° C., the composition ratio $\Gamma$ can also be increased from 15% to 85%, as will be seen from curve 1 of FIG. 7.

In this case, however, the particle size D is increased undesirably from 40 Å to 70 Å.

In contrast to the above, in the case of the Sn oxide ultrafine particle film produced by the method of the invention in an oxygen atmosphere of the same pressure (1 Torr) as the conventional process under application of a high-frequency electric power of 13.56 MHz and 150 W, no substantial change in the mean particle size D is caused by the heat treatment. In addition, a remarkable increase in the composition ratio $\Gamma$ from 65% to almost 100% is achieved by the heat treatment. This means that the heat treatment provides quite a favourable result.

Thus, as will be clearly understood from the characteristic curves shown in FIG. 7, it is possible to increase the composition ratio $\Gamma$ solely up to 100% without being accompanied by the undesirable increase of the mean particle size, by forming the ultrafine particle film in the oxygen gas excited by the high-frequency electric power of 150 W. From this fact, it will be seen that the method of the invention permits a highly effective and efficient production of ultrafine particle film having a high gas-sensitivity.

The increase of the composition ratio $\Gamma$ by heat treatment as shown in FIG. 7 essentially requires an oxidation of SnO particles into $SnO_2$ particles. An increase of the mean particle size, therefore, is inevitable.

Figure 8:
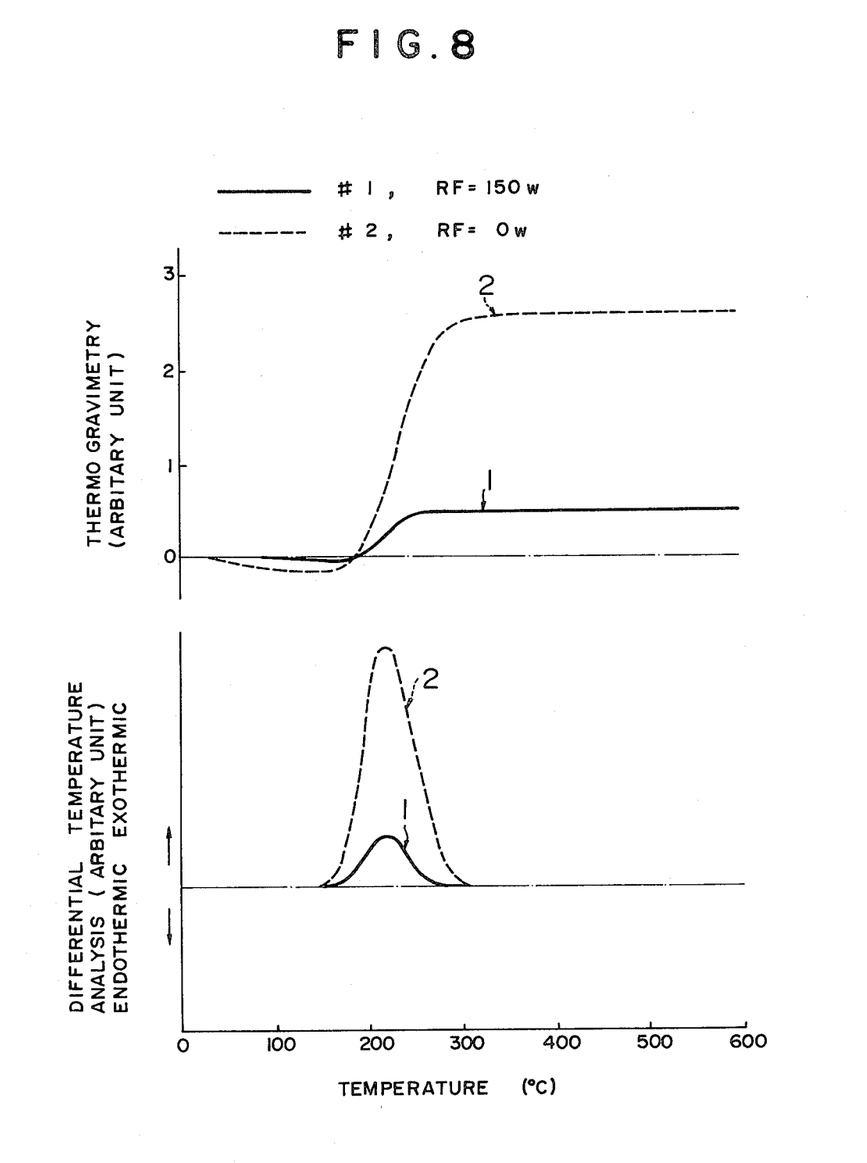

Referring back to curves 2 and 3 of FIG. 6, when the high-frequency electric power RF is zero, the mean particle size $D_{SnO}$ of the SnO ultrafine particles is greater than that $D_{SnO_2}$ of the $SnO_2$ ultrafine particles by a value of about 10 Å to 20 Å. Since the SnO ultrafine particles having greater size is oxidized into $SnO_2$ particles, the mean particle size is increased accordingly. This fact is proved also by FIG. 8. The ultrafine particle film manufactured by the method of the invention with an application of the high-frequency electric power has a high composition ratio $\Gamma$ of about 65% which is much greater than that of the film produced by the conventional process, as will be realized from the comparison between the curves 4 and 1 in FIG. 7. Therefore, in this case, the change of weight of the specimen due to the oxidation of SnO ultrafine particles is rather small, as will be understood from full-line curve 1 in FIG. 8. In sharp contrast to the above, in the specimen produced by the conventional process, the composition ratio $\Gamma$ is as small as 15% as will be seen from the curve 1 in FIG. 7. In consequence, a large change in weight is caused as shown by broken-line curve 2 in FIG. 8. This fact is clear also from the large heat-generating reaction as shown in the lower part of FIG. 8.

Figure 9:
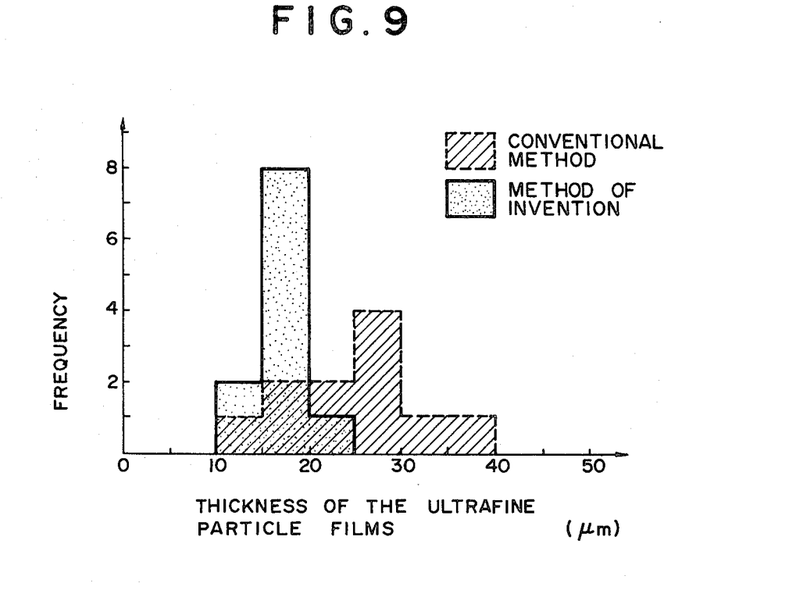
FIG. 9 is a diagram showing an improvement in the characteristics of ultrafine particle film in accordance with the method of the invention.

FIG. 9 shows an example of the improvement in the reproducibility and uniformity of the ultrafine particle film obtained from the use of the cylinder. In FIG. 9, the area encircled by broken-lines, i.e., the hatched area, represents the frequency of formation of the ultrafine particle film in relation to the film thickness when the film is formed by the conventional process using no cylinder, while the area encircled by the full-lines, i.e. the dotted area, represents the frequency as observed when the ultrafine particle film is formed by the method of the invention employing a cylinder. The superior effect ensured by the use of the cylinder will be understood from FIG. 9.

The characteristic features of the invention will be summarized as follows. First, it should be noted that the atmospheric gas of a reduced pressure is excited by the high-frequency coil. Second, the vapor of the material evaporated from the evaporation source is uniformly introduced into the excited atmospheric gas, i.e. with a good symmetry of the convection of the atmospheric gas thanks to the cooperation of the cylinder, the aperture of the partition plate and the shutter.

The combination of these two characteristic features alone can provide the method and apparatus for manufacturing an ultrafine particle film having a great practical utility, more uniformly, effectively and efficiently and at a higher reproducibility than possible in the prior art, but without losing the advantages of the prior art.

In the embodiment shown in FIG. 2, the cylinder 11 is positioned in the upper chamber above the partition plate 15. This arrangement, however, is not exclusive and the aperture 14 of the partition plate 15 may be penetrated by the cylinder 11, or the cylinder 11 may be disposed in the lower chamber below he partition plate 15. It is also possible to mount the metallic material 7 to be evaporated within the cylinder 11. The invention does not exclude the use of oxides, nitrides and carbides in place of the metallic material. It is still possible to place the substrate 12 in the cylinder 11.

Other changes and modifications are possible without departing from the scope of the invention which is limited solely by the attached claims.

What is claimed is:

1. A method of manufacturing an ultrafine particle film comprising the steps of:
   continuously supplying a gas into a vessel containing a cylinder, an evaporation source and a substrate;
   arranging said substrate and said evaporation source so that they oppose each other through said cylinder in the axial direction of said cylinder;
   continuously discharging the supplied gas from said vessel, thereby forming an atmospheric system within said vessel, said atmospheric system having a reduced gas pressure in the range of greater than approximately $10^{-1}$ Torr to approximately 10 Torr and a forced unidirectional flow of the gas from said evaporation source towards said substrate;
   said evaporation source producing evaporated matter;
   conveying said evaporated matter from said evaporation source to said substrate, after a steady evaporation rate is obtained, by means of said forced flow of gas; and
   said evaporated matter and said gas interacting to form ultrafine particles, whereby said ultrafine particles are deposited on said substrate to form said ultrafine particle film.

2. A method of manufacturing an ultrafine particle film as claimed in claim 1, wherein most of the gas supplied into said vessel is fed into said cylinder through an opening of said cylinder adjacent to said evaporation source and is discharged from said cylinder through a second opening of said cylinder, thereby forming a forced flow of gas through said cylinder.

3. A method of manufacturing an ultrafine particle film as claimed in claim 1, wherein a portion of the gas continuously supplied into said vessel is fed into said cylinder through an opening of said cylinder adjacent to said evaporation source and is discharged from said cylinder through a second opening of said cylinder, thereby forming a forced flow of said gas in said cylinder.

4. A method of manufacturing an ultrafine particle film as claimed in claim 1, further comprising a high-frequency coil surrounding said cylinder and adapted to excite the gas in said cylinder, whereby said evaporated matters from said evaporation source are moved through the atmosphere of said excited gas to act on said gas, thereby forming said ultrafine particles which are to be deposited on said substrate.

5. An apparatus for manufacturing an ultrafine particle film comprising:
   a vessel having a gas introduction opening and a gas discharge opening;
   means for reducing the pressure of the atmosphere in said vessel;
   an evaporation source, a substrate and a cylinder disposed in said vessel, said evaporation source and said substrate being arranged to be opposed to each other across said cylinder in the axial direction of said cylinder;
   means for supplying a gas into said vessel through said gas introduction opening and for discharging said gas from said gas discharge opening so as to establish a gas atmosphere having a reduced gas pressure in cooperation with said reducing means;
   means for introducing evaporated matter evaporated from said evaporation source into said gas atmosphere after a steady evaporation rate is obtained; said gas being continuously introduced into said vessel and discharged from said vessel so as to produce a forced flow of said gas through said cylinder from the side adjacent to said evaporation source to the side adjacent to said substrate.

6. An apparatus for manufacturing an ultrafine particle film as claimed in claim 5, further comprising a high-frequency coil wound around said cylinder.

* * * * *